(12) United States Patent
Ikeda

(10) Patent No.: US 6,414,879 B1
(45) Date of Patent: Jul. 2, 2002

(54) SEMICONDUCTOR MEMORY DEVICE

(75) Inventor: Hitoshi Ikeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/996,616

(22) Filed: Nov. 30, 2001

Related U.S. Application Data

(62) Division of application No. 09/793,602, filed on Feb. 27, 2001.

(30) Foreign Application Priority Data

Feb. 29, 2000 (JP) ......................................... 2000-054881

(51) Int. Cl.[7] ................................................. G11C 16/04
(52) U.S. Cl. ........................... 365/189.01; 365/189.05; 365/230.08; 365/233
(58) Field of Search ....................... 365/189.01, 189.05, 365/230.08, 233, 230.01, 191, 194

(56) References Cited

U.S. PATENT DOCUMENTS

| | | | | |
|---|---|---|---|---|
| 5,392,239 A | * | 2/1995 | Margulis et al. | 365/189.01 |
| 5,668,760 A | | 9/1997 | Hazen | 365/189.01 |
| 5,912,847 A | | 6/1999 | Tamaki | 365/189.05 |
| 6,144,616 A | | 11/2000 | Suzuki et al. | 365/233 |
| 6,151,268 A | | 11/2000 | Yoshikawa | 365/230.09 |
| 6,175,535 B1 | | 1/2001 | Dhong et al. | 365/236 |
| 6,243,279 B1 | | 6/2001 | Maesako et al. | 365/189.01 |

* cited by examiner

*Primary Examiner*—David Lam
(74) *Attorney, Agent, or Firm*—Arent Fox Kintner Plotkin & Kahn, PLLC

(57) ABSTRACT

A semiconductor memory device of a dynamic type having an interface of a static-type semiconductor memory device includes a memory cell array, and a control circuit controlling a read operation to be initiated in response to a predetermined signal externally applied thereto before a read or write command is externally applied to the control circuit.

9 Claims, 13 Drawing Sheets

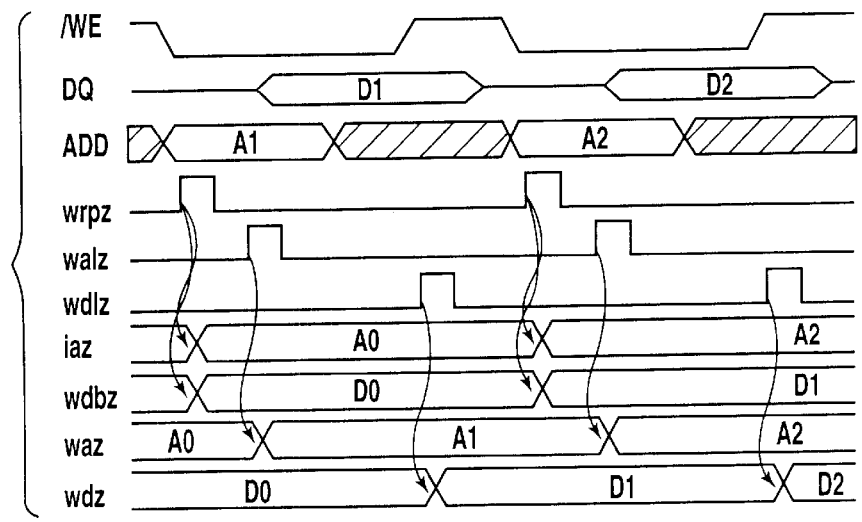
FIG.2A
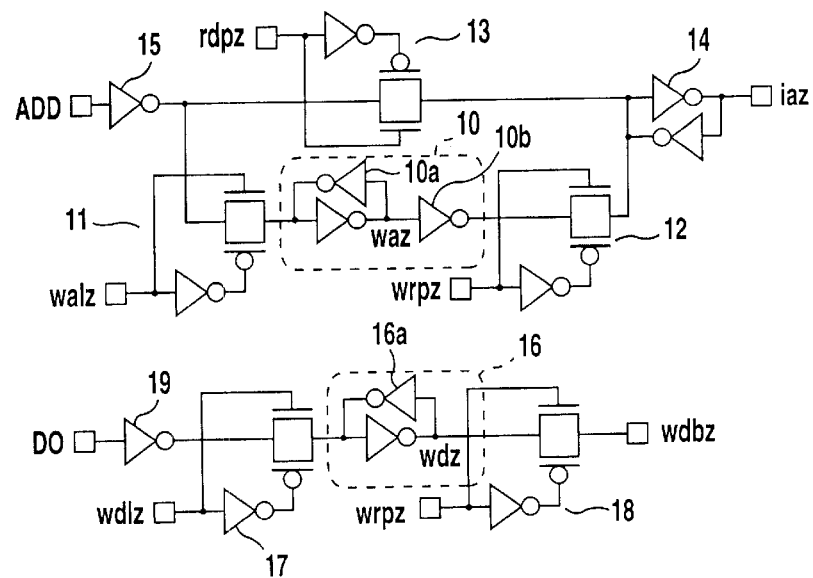
FIG.2B
FIG.2C

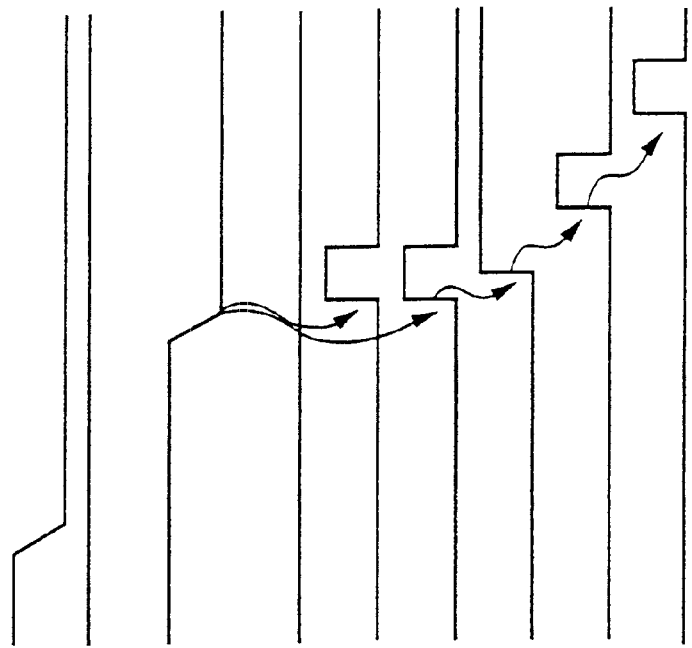
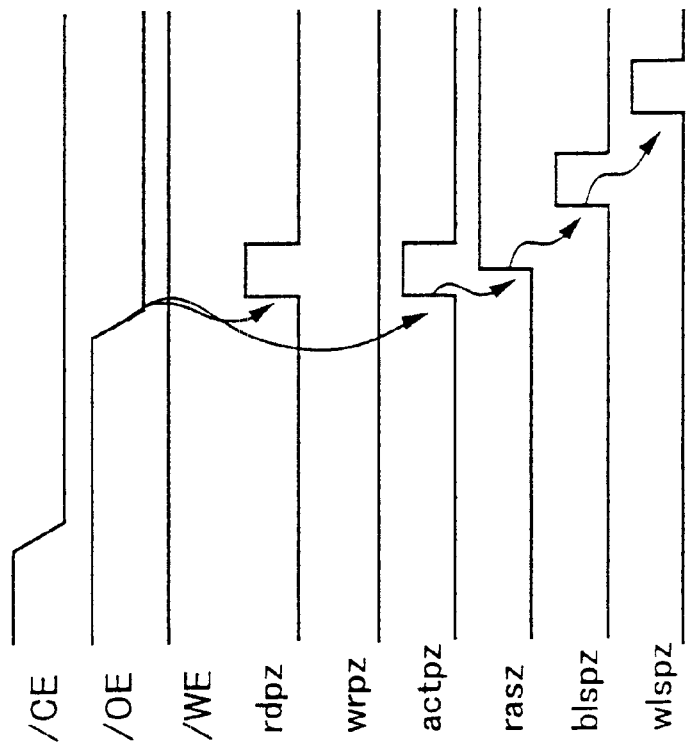

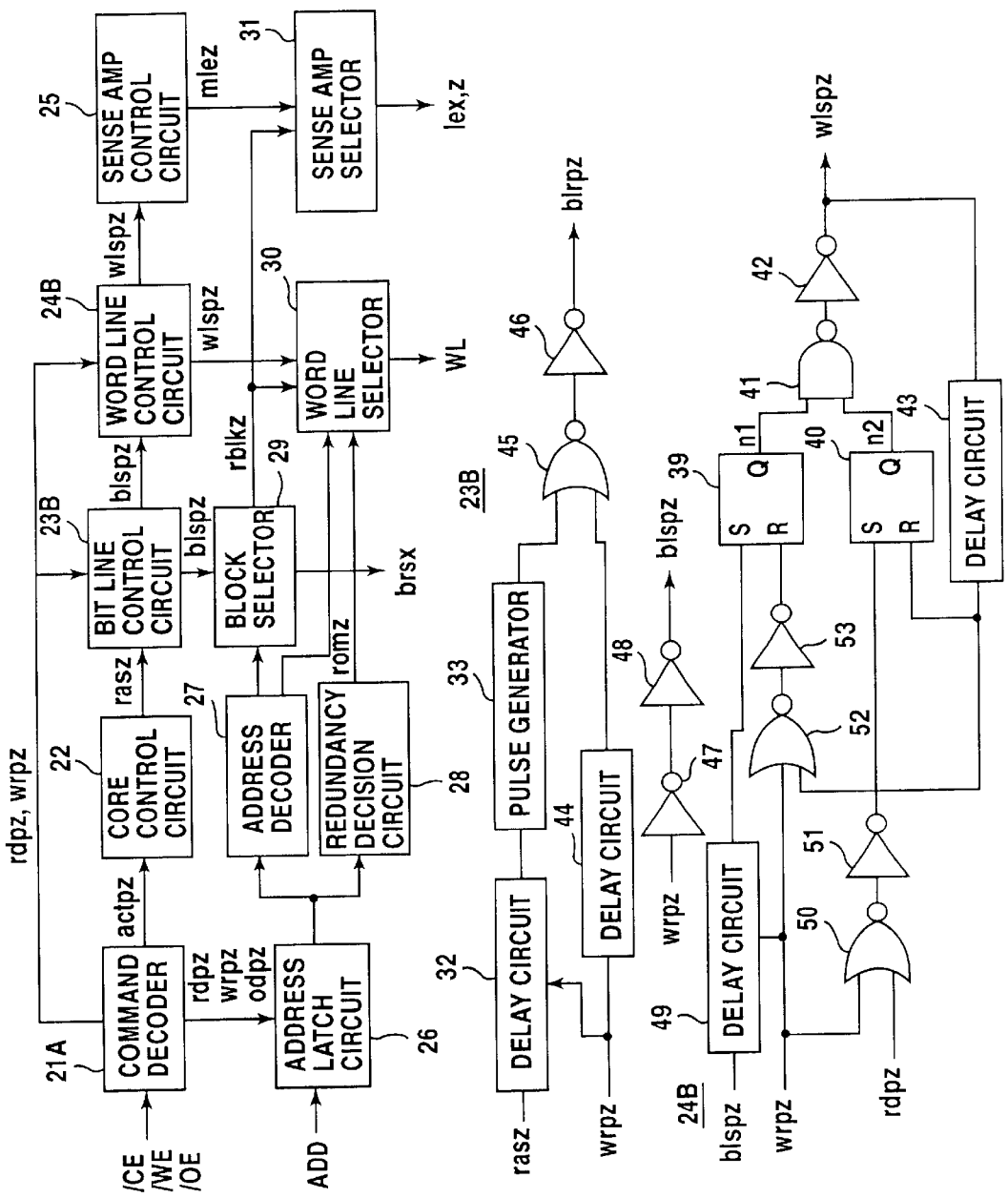

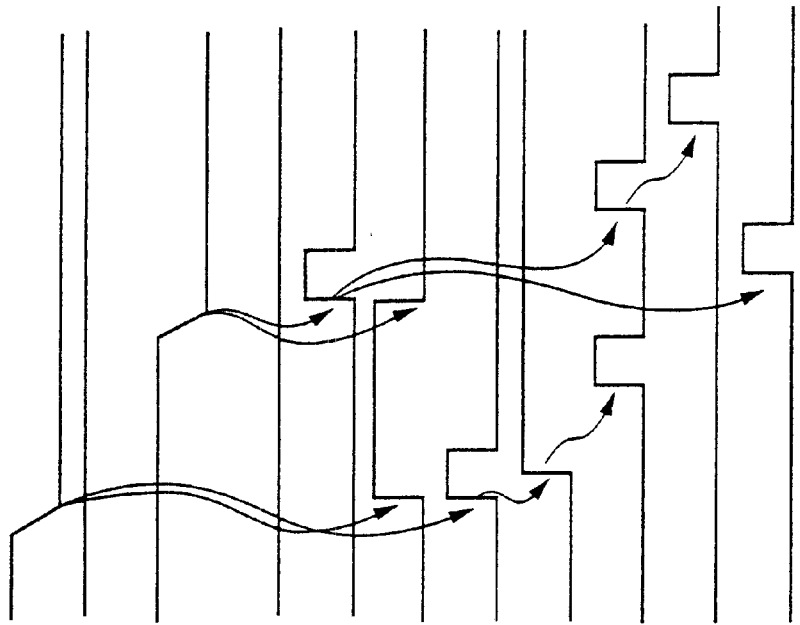
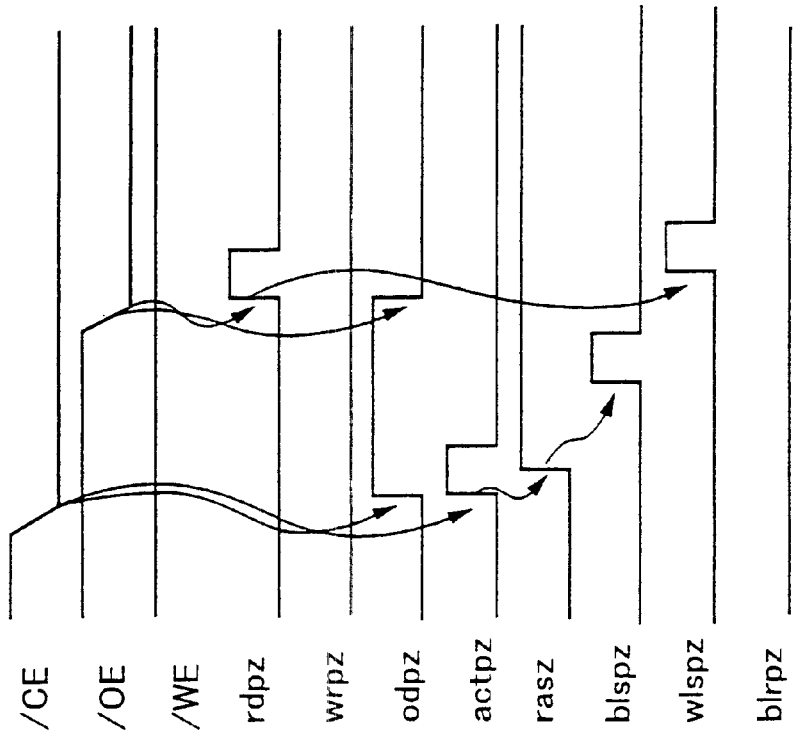
FIG. 13A
FIG. 13B

SEMICONDUCTOR MEMORY DEVICE

This is a Division of application Ser. No. 09/793,602 filed Feb. 27, 2001. The disclosure of the prior application is hereby incorporated by reference herein in its entirety.

BACKGROUND OF THE INVENTION

1. Field of the Invention

The present invention generally relates to semiconductor memory devices, and more particularly, to a DRAM type semiconductor memory device which has an asynchronous SRAM type interface in which a command is received and a corresponding operation is started.

2. Description of the Related Art

Recently, a compact mobile terminal such as a cellular phone has collaborated with the Internet and handled a large amount of data. This has stimulated a large-capacity memory. Nowadays, an SRAM (Static Random Access Memory) is employed in the cellular phones because of its low power consumption. However, the SRAM does not have a high integration density. The larger the SRAM capacity, the more expensive the cost. In contrast, the DRAM is a low-cost, high-capacity memory. The DRAM and SRAM do not have different command systems. This does not allow the SRAM to be simply interchanged with the DRAM. In this case, a major problem arises from the timing at which write data is input. In the DRAM, write data is latched based on the start of a write cycle (at this time, a chip enable signal /CE and a write enable signal /WE fall). In the SRAM, write data is latched based on the end of the write cycle (at this time, the chip enable signal /WE and the write enable signal /WE rise).

FIG. 1 is a timing chart of a data write operation in which data is written into an SRAM. After the chip enable signal /CE (not shown) falls, an address add is latched in synchronism with the falling edge of the write enable signal /WE, and write data DQ is latched in synchronism with the rising edge of the write enable signal /WE. If the DRAM is operated in the same manner as shown in FIG. 1, the current write operation may extend to the next command cycle. Thus, if the read command is followed by a write command, the read operation will start with a delay. This delays outputting of data. In order to avoid this problem, a late-write system has been proposed.

FIG. 2A is a timing chart of the latewrite system, FIG. 2B is a circuit diagram of an address latch circuit provided in the DRAM, and FIG. 2C is a circuit diagram of a data latch circuit provided therein.

The address latch circuit shown in FIG. 2B latches an address ADD supplied from the outside of the DRAM, and includes a buffer 10, gates 11, 12 and 13, a latch 14, and an inverter 15. Each of the gates 11–13 is made up of a transfer gate and an inverter. The buffer 10 includes a latch 10a and an inverter 10b. The data latch circuit shown in FIG. 2C latches data DQ supplied from the outside of the DRAM, and includes a buffer 16, gates 17 and 18, and an inverter 16a.

The write operation starts in synchronism with the falling edge of the write enable signal /WE. A write command wrpz, which is generated by a command decoder that is not shown for the sake of simplicity, is applied to the address latch circuit shown in FIG. 2B and the data latch circuit shown in FIG. 2C. In response to the write command wrpz, address A0, which has been latched in the buffer 10 in the previous write cycle, passes through the gate 12 and the latch 14. The output signal of the latch 14 is an internal address iaz. In response to the above write command wrpz, data D0, which has been latched in the buffer 16 in the previous write cycle, passes through the gate 18. The output signal of the gate 18 is an internal write signal wdbz. Next, a write address latch signal walz causes address A1 to be latched in the buffer 10 via the gate 11. A write data latch signal wdlz is generated from the rising edge of the write enable signal /WE. The signal wdlz causes write data D1 to be latched in the buffer 16. In the write cycle, the write data D0 is written into a cell specified by the write address A0, and simultaneously the write address A1 and the write data D1 are respectively latched in the buffers 10 and 16. A write address waz latched in the buffer 10 changes from A0 to A1, and write data wdz latched in the buffer 16 changes from D0 to D1. Similarly, in the next write cycle, write data D1 is written into a cell specified by address A1, and simultaneously next write address A2 and write data D2 are respectively latched in the buffers 10 and 16.

In a read operation, the address ADD latched by a read command rdpz is output from the address latch circuit as the internal address iaz. That is, the read address is not latched in the buffer 10.

As described above, the late-write system enables write data to be written in the next write cycle. Thus, even when the read command follows the write command, the corresponding read operation can start without a considerable delay, so that data can be output promptly.

The SRAM has a state in which /CE=L (low level), /WE=H (high level), and /OE (output enable signal)=H. This state is called an output disable state. As shown in timing charts of FIGS. 3A and 3B, the SRAM is set to the write state when the write enable signal /WE falls in the output disable state (FIG. 3B), and is set to the read state when the output enable signal /OE falls in the output disable state (FIG. 3A). As has been described previously, the late-write system uses different addresses in the read and write operations. More particularly, the read operation uses the latched read address as it is. In contrast, the write operation uses the write address that was latched in the immediately previous write cycle. Thus, the device is set to the write state when the write enable signal /WE falls in the output disable state, and is set to the read state when the output enable signal /OE falls in the output disable state.

Generally, the access time in the read operation from the output disable state is defined so as to be shorter than that of the normal read operation in which the output enable signal /OE is L and the Chip enable signal /CE falls. Therefore, it is too late to start the read operation after the output enable signal /OE switches to L, so that data cannot be output in time.

SUMMARY OF THE INVENTION

It is a general object of the present invention to provide a semiconductor memory device in which the above disadvantages are eliminated.

A more specific object of the present invention is to provide a semiconductor memory device in which data can be read from the output disable state more quickly.

The above objects of the present invention are achieved by a semiconductor memory device of a dynamic type having an interface of a static-type semiconductor memory device, comprising: a memory cell array; and a control circuit controlling a read operation to be initiated in response to a predetermined signal externally applied thereto before a read or write command is externally applied to the control circuit.

The above objects of the present invention are also achieved by A semiconductor memory device of a dynamic type having an interface of a static-type semiconductor memory device, comprising: an address latch circuit that latches an external address; and a command decoder that controls the address latch circuit to latch the external address when receiving a predetermined signal externally supplied before a write command or a read command is externally applied to the semiconductor memory device.

BRIEF DESCRIPTION OF THE DRAWINGS

Other objects, features and advantages of the present invention will become more apparent from the following detailed description when read in conjunction with thy accompanying drawings, in which:

FIGS. 2A, 2B and 2C are diagrams illustrating a late-write system;

FIGS. 7A and 7B are timing charts of sequences of controlling a core in the configurations shown in FIGS. 6A through 6C;

FIG. 12A is a block diagram of a semiconductor memory device according to a second embodiment of the present invention;

FIG. 12B is a circuit diagram of a bit line control circuit shown in FIG. 12A;

FIG. 12C idea circuit diagram of a word line control circuit shown in FIG. 12A;

FIGS. 13A and 13B are timing charts of operations of the configurations shown in FIGS. 12A through 12C.

DESCRIPTION OF THE PREFERRED EMBODIMENTS

As has been described with reference to FIGS. 3A and 3B, no operation is performed in the output disable state in the DRAM that operates with the SRAM interface. Rather, the DRAM starts an operation after the write enable signal /WE or the output enable signal /OE changes to L.

Figures 4A, 4B:
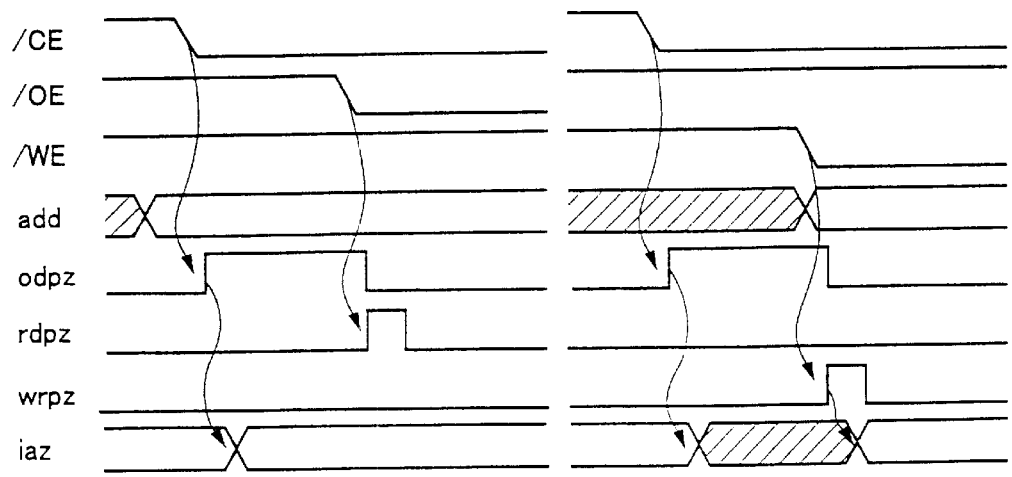
FIG. 4A is a timing chart of a read operation initiated from an output disable state according to the present invention.
FIG. 4B is a timing chart of a write operation initiated from an output disable state according to the present invention.

In contrast, the present invention operates as shown in FIGS. 4A and 4B. More particularly, FIG. 4A shows a read operation from the output disable state, and FIG. 4B shows a write operation from the output disable state. According to the present invention, an output disable command odpz is newly introduced, which command rises (switches to H) when the chip enable signal /CE switches to L. The output disable command odpz makes it possible to latch the external address in the address latch circuit in the output disable state.

Figure 5:
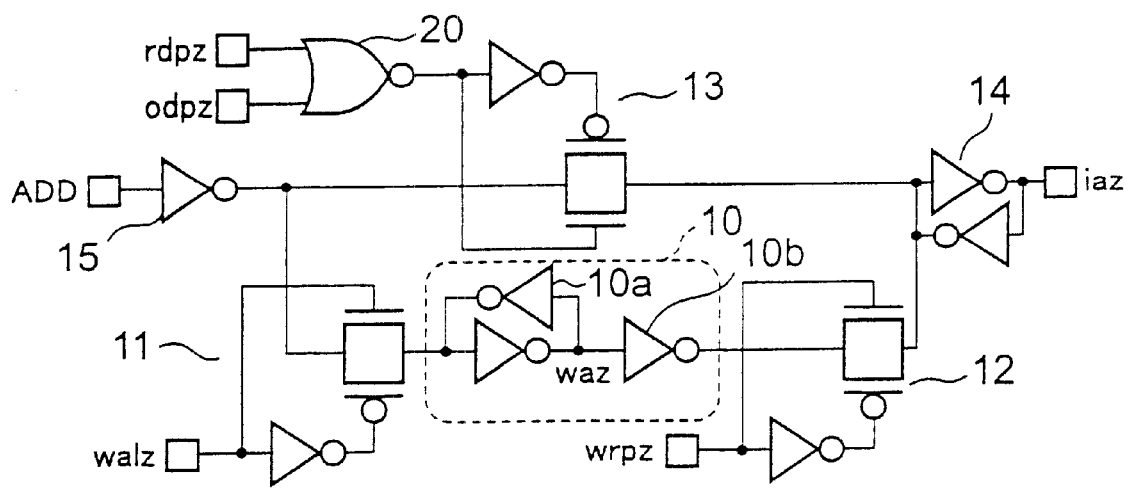
FIG. 5 is a circuit diagram of an address latch circuit which implements the operations shown in FIGS. 4A and 4B.

FIG. 5 is a circuit diagram of a circuit configuration of the address latch circuit according to an embodiment of the present invention. In FIG. 5, parts that are the same as those shown in FIG. 2B are given the same reference numerals. A NOR gate 20 is provided in front of the gate 13. The NOR gate 20 performs a NOR operation on the read command rdpz and the output disable command odpz. That is, the NOR gate 20 receives either the read command rdpz or the output disable command odpz, and makes the gate 13 open. Thus, the external address ADD is allowed to pass through the gate 13 and is latched in the latch 14.

As shown in FIG. 4A, when the chip enable signal /CE switches to L to thus set the device to the output disable sate, the output disable command odpz is applied to the NOR gate 20. Thus, the address ADD is allowed to pass through the gate 13, and is latched in the latch 14, which outputs the internal address iaz. That is, in response to the output disable command odpz, the address ADD is latched in the address latch circuit in the output disable state. Then, the read operation goes halfway, as will be described later. When the output enable signal /OE changes to L, the read command rdpz is switched to H and the read operation is continuously performed.

In FIG. 4B, the external address ADD is latched in the address latch 4 as in the case of FIG. 4A. When the write enable signal /WE switches to L, the write command wrpz is switched to H. Thus, the gate 12 is made open, and the address latched in the buffer 10 is latched in the latch 14. Thus, the address (hatched part) latched in response to the output disable command odpz is substituted for the address latched in the buffer 10 and becomes the internal address iaz.

Figure 1:
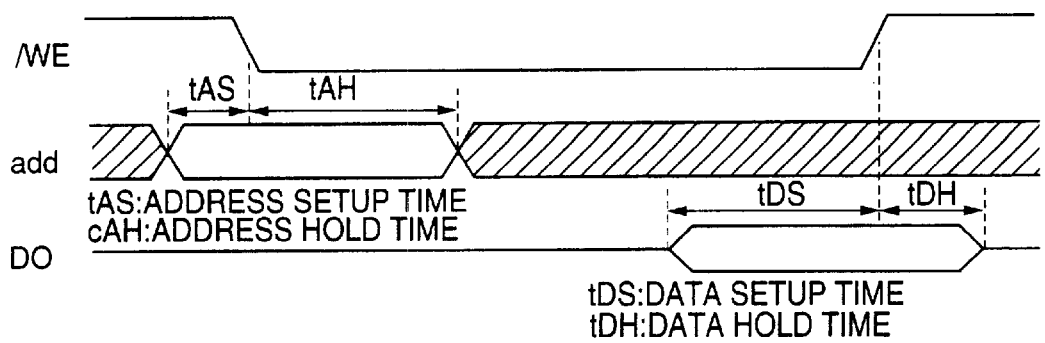
FIG. 1 is a timing chart of a write timing of an SRAM.
Figures 3A, 3B:
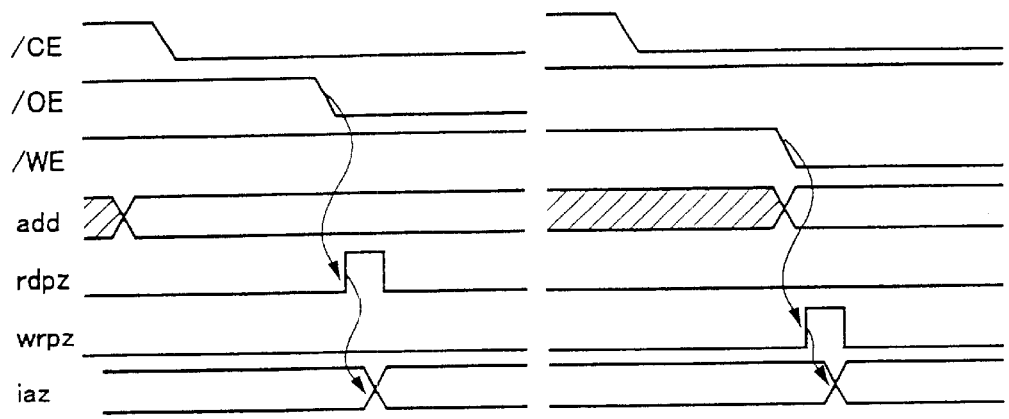
FIG. 3A, is a timing chart of a normal read operation initiated from an output disable state in a conventional device.
FIG. 3B is a timing chart of a normal write operation initiated from an output disable state in a conventional device.

It will be seen from comparison between FIG. 3A and FIG. 4A that data can be read promptly from the output disable state.

It is necessary to determine how much the read operation should progress using the external address latched in response to the output disable command odpz generated when the circuit switches to the output disable state. In other words, it is necessary to determine which parts of a core should be activated. This is intended to interrupt the read operation and facilitate the write operation in a case where the write enable signal /WE changes to L and a write operation is instructed after the read operation has been started in the output disable state (the case of FIG. 4B). This will be described later.

A description will now be given of a conventional sequence of activating the core and then a unique sequence of the present invention.

Figures 6A, 6B, 6C:
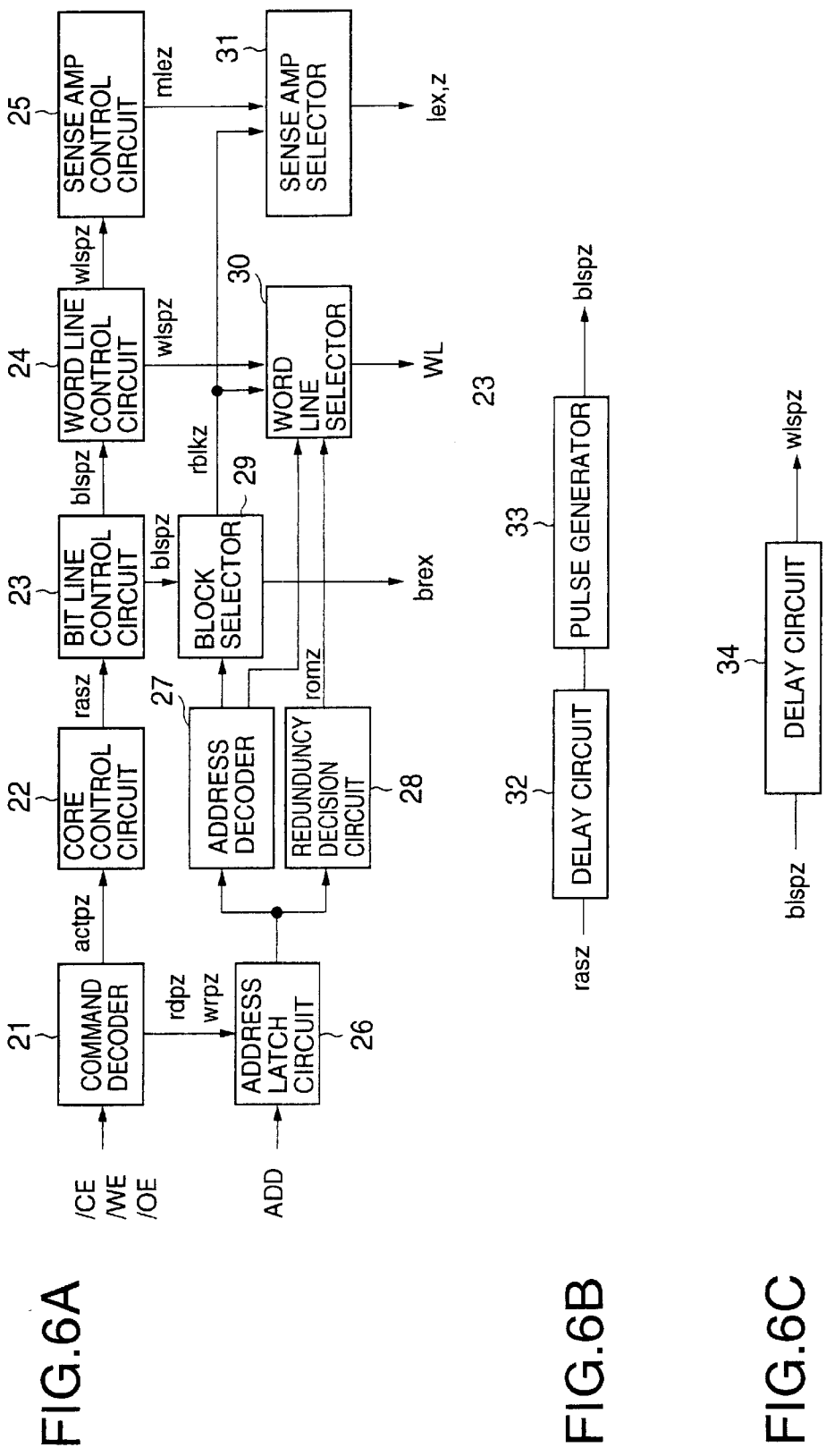
FIG 6A a block diagram of a peripheral circuit configuration of a core of a DRAM employed in an embodiment of the present invention.
FIG. 6B is a block diagram of a configuration of a bit line control circuit 23 shown in FIG. 6A.
FIG. 6C is a block diagram of a configuration of a bit line control circuit shown in FIG. 6A.

FIG. 6A is a block diagram of a peripheral circuit configuration of a core of a DRAM. The DRAM includes, as peripheral circuits, a command decoder 21, a core control circuit 22, a bit line control circuit 23, a word line control circuit 24, a sense amplifier control circuit 25, an address latch circuit 26, an address decoder 27, a redundancy decision circuit 28, a block selection circuit 29, a word line selection circuit 30, and a sense amplifier selection circuit 31. These peripheral circuits control a core, which will be described later with reference to FIG. 9. FIG. 6B is a block diagram of a configuration of the bit line control circuit 23, which is made up of a delay circuit 32 and a pulse generator circuit 33. FIG. 6C is a block diagram of a configuration of the word line control circuit 24, which includes a delay circuit 34.

FIGS. 7A and 7B are timing charts of a core activation sequence. More particularly, FIG. 7A shows a read operation, and FIG. 7B shows a write operation.

Figure 8:
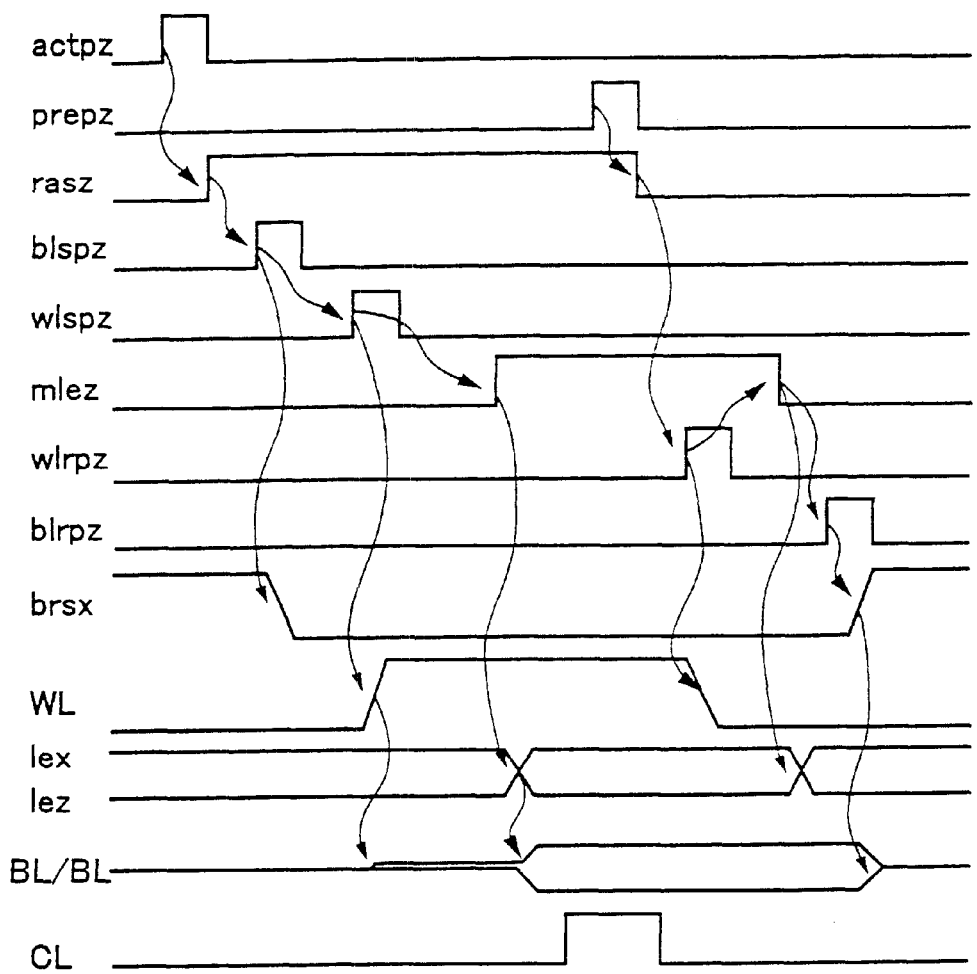
FIG. 8 is a timing chart of a sequence of activating the core in the configurations shown in FIGS. 6A through 6C.
Figure 9:
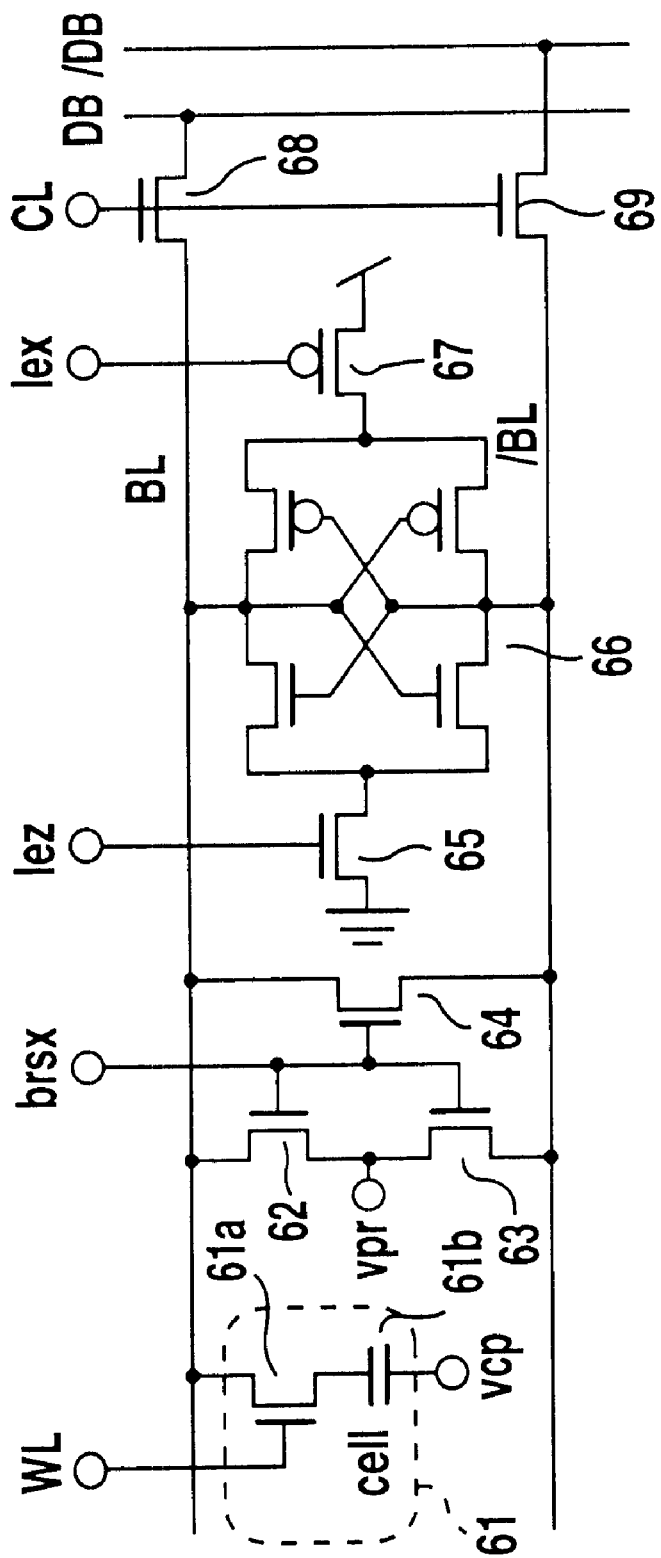
FIG. 9 is a circuit diagram of a configuration of the core.

FIG. 8 is a timing chart of an operation of a core shown in FIG. 9. As shown in FIG. 9, the core includes a large number of memory cells arranged in a matrix formation. The two-dimensional array of memory cells is divided into a plurality of blocks. The core shown in FIG. 9 includes a memory cell, bit line precharge transistors 62 and 63, a bit line short-circuit transistor 64, a sense amplifier 66, transistors 65 and 67 for controlling the sense amplifier 66, and transistors 68 and 69 forming transfer gates. The memory cell 61 is made up of a cell transistor 61a and a cell capacitor 61b, and is connected to one of a pair of bit lines BL and /BL (BL in FIG. 9). The bit lines BL and /BL are connected to internal data buses DB and /DB via the transfer gates 68 and 69, respectively. A reference "vpr" denotes a bit line precharge voltage.

A description will now be given, with reference to FIGS. 6A through 6C, 7A, 7B, 8 and 9, of a sequence of activating the core and an operation of the activated core.

A command is defined by the combination of the control signals /CE, /WE and /OE. In FIG. 7A, the output enable signal /OE switches to L from the output disable state. The command decoder 21 outputs an active command actpz to the core control circuit 22 and outputs a read command rdpz to the address latch circuit 26. Responsive to the read command rdpz, the external address ADD latched in the address latch circuit 26, the read address in this case is output to the address decoder 27 and the redundancy decision circuit 28. The redundancy decision circuit 28 outputs a signal romz for selecting a redundant word line to the word line selector circuit 30 if the read address indicates a defective bit (at the time of redundancy).

Responsive to the active command actpz, the core control circuit 22 outputs a core activation signal rasz to the bit line control circuit 23. The delay circuit 32 (FIG. 6B) of the bit line control circuit 23 delays the core activation signal rasz by the time that is determined taking the time necessary for address decoding and redundancy decision making into consideration. A delayed core activation signal rasz is output to the pulse generator circuit 33. Then, the pulse generator 3S circuit 33 notifies the word line control circuit 24 and the block selector circuit 29 of the time at which the bit lines are released from the short-circuited state. The block selector circuit 29 performs a logical operation on a timing signal blspz and an associated address bit from the address decoder, and sets a bit line short-circuit control signal brsx of the selected block. Thus, the transistors 62 through 64 shown in FIG. 9 are turned OFF, so that the bit lines are released from the short-circuited state. The delay circuit 34 of the word line control circuit 24 (FIG. 6C) delays the timing signal blspz by a given time, and outputs a resultant word line drive timing signal wlspz to the sense amplifier control circuit 25 and the word line selector circuit 30.

The block selector circuit 29 outputs a signal rblkz indicating the selected block to the word line selector circuit 30 and the sense amplifier selector circuit 31. The word line selector circuit 30 performs a logical operation on the block selection signal rblkz, the word line selection address and the redundant word line selection signal romz, and switches the word line WL to H in response to the timing signal wlspz. When the word line WL is switched to H, data in the cell 61 is read out to the bit lines BL and /BL.

The sense amplifier control circuit 25 outputs a timing signal mlez for activating the sense amplifier to the sense amplifier selector circuit 31 when a given constant time lapses from receipt of the word line drive timing signal wlspz. Responsive to the signal wlspz, the sense amplifier selector circuit 31 outputs sense amplifier drive signals lex and lez to the transistors 67 and 65, respectively, so that these transistors are turned ON. The sense amplifier 66 is activated and amplifiers the difference in potential between the bit lines BL and /BL. The transistors 68 and 69 are turned ON in response to a column selection signal CL (not shown in FIGS. 6A through 6C for the sake of simplicity) from the address decoder 27 of the column system. Thus, the data that are read out to the bit lines BL and /BL and are amplified are output to internal data buses DB and /DB.

The data on the bit lines BL and /BL are amplified and written into the cell again (restore). Then, a bit line precharge operation is initiated. The core control circuit 22 receives a precharge command prepz (not shown in FIGS. 6A through 6C for the sake of simplicity) from the command decoder 21, and falls the activation signal rasz. The word line control circuit 24 generates a timing signal wlrpz for resetting word lines from the falling edge of the activation signal rasz, the signal wlrpz being applied to the word line selector circuit 30. Responsive to the timing signal wlrpz, the word line selector circuit 30 falls the selected word line WL. The timing signal wlrpz is generated by a pulse generator circuit, which generates a pulse in response to the falling edge of the activation signal rasz.

The sense amplifier circuit 25 falls the sense amplifier activation timing signal mlez when a given time lapses from the timing signal wlrpz. In response to the falling edge of the timing signal mlez, the bit line control circuit 23 internally generates a timing signal blrpz, and outputs it to the block selector circuit 29. Then, the block selector circuit 29 sets the bit line short-circuit control signal brsx to H, so that the bit lines BL and /BL are short-circuited. The timing signal blrpz is generated by a pulse generator circuit that generates a pulse in response to the falling edge of the timing signal mlez.

The above description is directed to the sequence of activating the core in the read operation. The core activating sequence in the write operation shown in FIG. 7B is almost the same as the core activating operation. The difference between the write operation and the read operation is as follows. The write operation starts when the write enable signal /WE switches to L. Responsive to this change, the write command wrpz is output from the command decoder 21 to the address latch circuit 26.

A description will now be given of an embodiment of the present invention. As has been described, the read operation is initiated when the device is switched to the output disable state and is allowed to progress halfway. In this case, if the associated word line is activated, the write operation after the setting of the output disable state cannot be initiated unless a series of given operations, namely, the sense amplifier activation, restore, word line reset, and bit line short-circuit, is performed. Hence, the initiation of the write operation will greatly be delayed. Taking the above into account, the degree of progress of the read operation should be determined. In practice, it is conceivable to cause the read operation to progress up to redundancy decision making or the time immediately before the word line is activated.

A description will be given of a first embodiment of the present invention directed to a sequence of having the read operation to progress up to redundancy decision making, and a second embodiment directed to a sequence of having the read operation to progress up to the time immediately before the word line is activated.

Figure 10A:
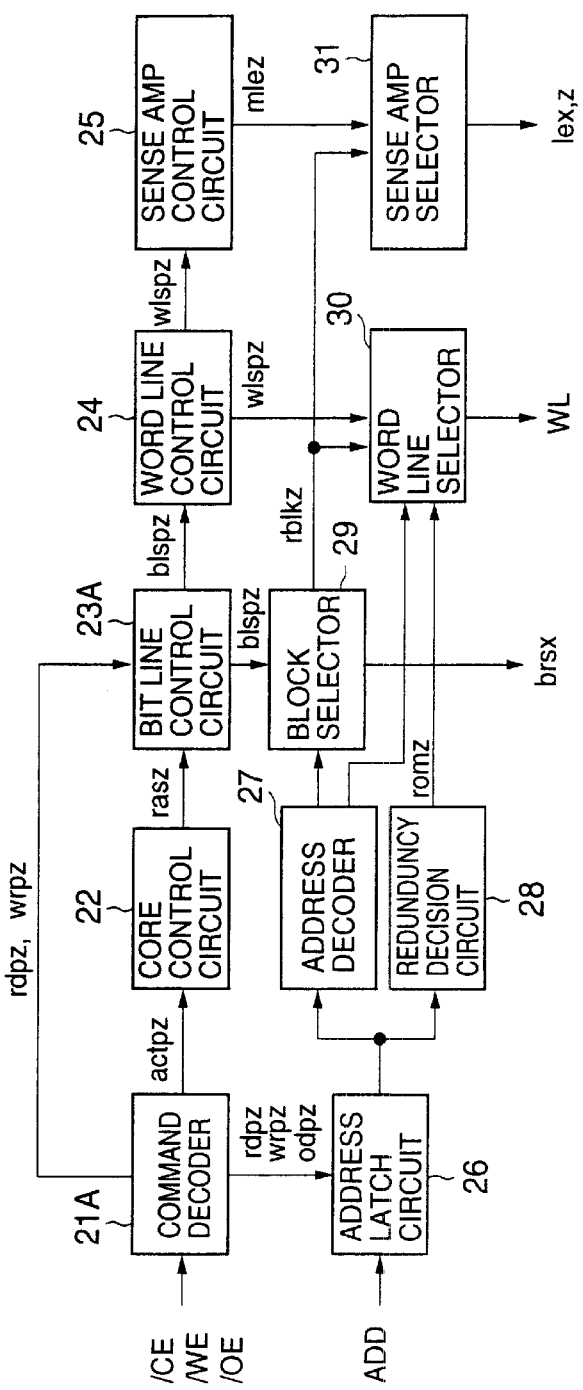
FIG. 10A is a block diagram of a semiconductor memory device according to a first embodiment of the present invention.
Figure 10B:
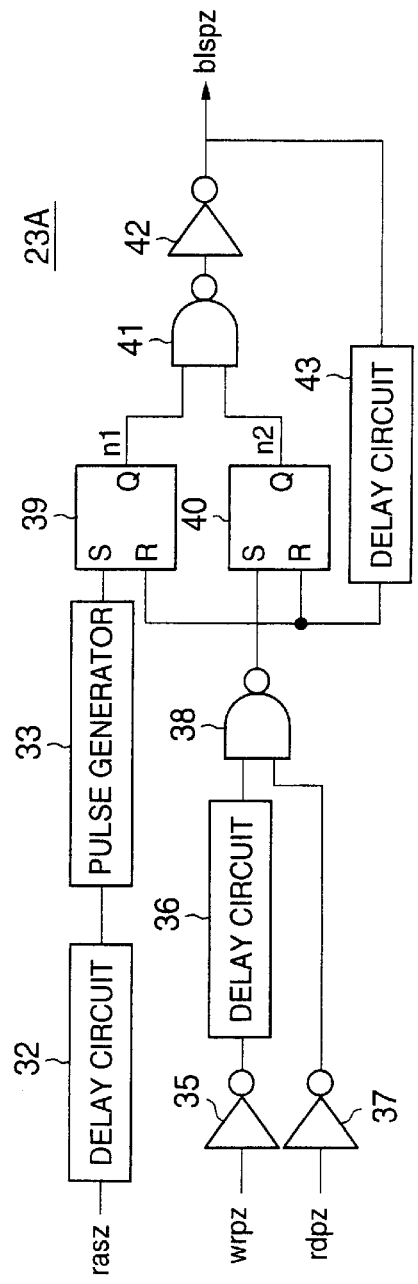
FIG. 10B is a circuit diagram of a bit line control circuit shown in FIG. 10A.

FIG. 10A is a block diagram of a semiconductor memory device according to the first embodiment of the present invention. In FIG. 10A, parts that are the same as those shown in the previously described figures are given the same reference numerals. FIG. 10B is a block diagram of a bit line control circuit 23A shown in FIG. 10A.

Referring to FIG. 10A, a command decoder 21A and bit line control circuit 23A are different from corresponding those shown in FIG. 6A. The command decoder 21 outputs the read command rdpz and the write command wrpz to the bit line control circuit 23A as well as the address latch circuit 26. Further, the command decoder 21A generates the aforementioned output disable command odpz, which is output to the address latch circuit 26. The command decoder 21A outputs the active command actpz to the core control circuit 22 at the same time as the output disable command odpz. The address latch circuit 26 latches the external address ADD when the device is set to the output disable state as in the case of receipt of the normal read command rdpz or the normal write command wrpz. The bit line control circuit 23A is configured so as to generate the timing signal blspz for releasing the bit lines from the short-circuited state when receiving the activation signal rasz and additionally the read command rdpz or the write command wrpz. This causes the bit lines to be short-circuited after the determination as to which one of the read operation and the write operation should be performed.

As shown in FIG. 10B, the bit line control circuit 23A includes, in addition to the aforementioned delay circuit 32 and the pulse generator circuit 33, inverters 35 and 37, a delay circuit 36, a NAND gate 38, RS flip-flops 39 and 40, a NAND gate 41, an inverter 42, and a delay circuit 43.

Figure 11A:
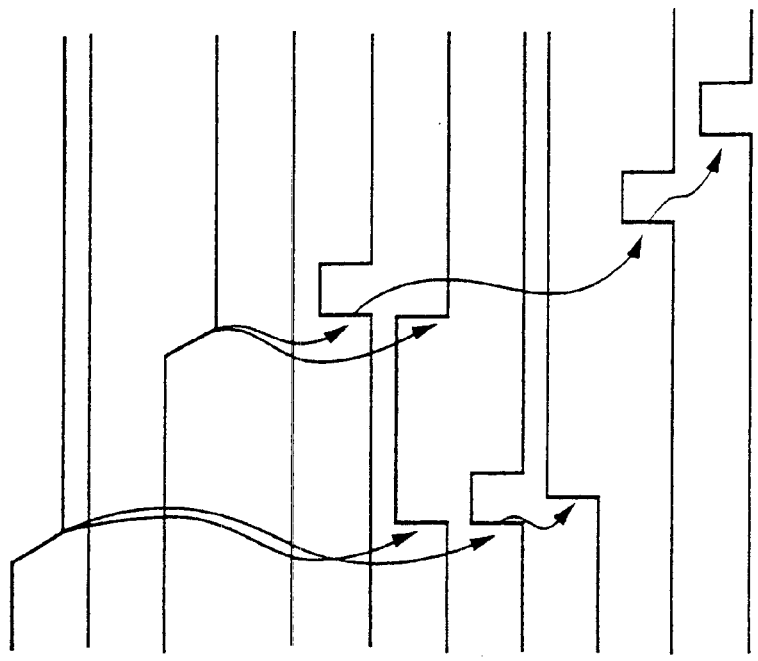
FIGS. 11A and 11B are timing charts of operations of the configurations shown in FIGS. 10A and 10B.
Figure 11B:
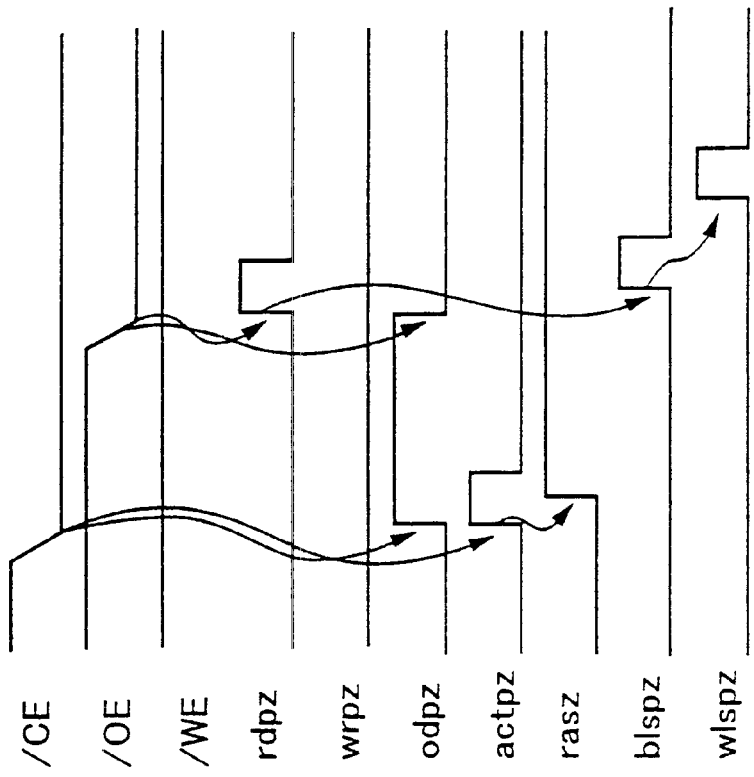

A description will be given, with reference to FIGS. 11A and 11B, of the read operation that progresses up to redundancy decision making after the external address is latched in the configurations shown in FIGS. 10A and 10B. FIG. 11A shows a case where the output enable signal /OE changes to L from the output disable state (read operation). FIG. 11B shows a case where the write enable signal /WE changes to L from the output disable state.

AS shown in FIGS. 11A and 11B, the device is switched to the output disable state when the chip select signal /CE switches to L in the state in which /OE=H and /WE=H. The command decoder 21A generates the output disable command odpz. In response to the output disable command odpz, the address latch circuit 26 latches the external address ADD, which is then output to the address decoder 27 and the redundancy decision circuit 28. The address decoder 27 decodes the external address ADD, and the redundancy decision circuit 29 makes a redundancy decision. The command decoder 21A generates the active command actpz when the chip select signal /CE changes to L. The active command actpz is supplied to the core control circuit 22, which outputs the core activation signal rasz.

The core activation signal rasz passes through the delay circuit 32 and the pulse generator circuit 33 shown in FIG. 10B, and sets the flip-flop 39. Thus, the output n1 of the flip-flop 39 is changed to H. As has been described previously, the delay circuit 32 delays the input signal until the address decoding and redundancy decision making are completed. At the time when the output n1 is changed to H in response to the core activation signal rasz, the signals /OE and /WE are both H, so that the flip-flop 40 is maintained in the reset state.

The timing signal blspz for releasing the bit lines from the short-circuited state is output when the output enable signal /OE switches to L (read operation) shown in FIG. 7A or when the write enable signal /WE switches to L (write operation) shown in FIG. 7B. In FIG. 10A, the read command rdpz passes through the inverter 37 and the NAND gate 38, and sets the flip-flop 40. The write command wrpz passes through the inverter 35, the delay circuit 36 and the NAND gate 40, and sets the flip-flop 40. The delay circuit 36 is provided to delay the write command wrpz by the time necessary to complete the address decoding and redundancy decision making because the write operation uses a write address different from the read address of the read operation that progresses halfway (this has been described with reference to FIG. 4B). When the flip-flop 40 is set, its output n2 is changed to H. Thus, n1=n2=H, and the output of the NAND gate 41 is changed to L. Further, the timing signal blspz for releasing the bit lines from the shortcircuit state changes to H, so that the H-level state is maintained for the delay time defined by the delay circuit 43. That is, the delay circuit 43 delays the timing signal blspz by the given time, and then resets the flip-flops 39 and 40. The subsequent core operation is the same as shown in FIG. 8.

The output disable command odpz falls when the write enable signal /WE or the output enable signal /OE falls.

FIG. 12A is a block diagram of a semiconductor memory device according to the second embodiment of the present invention. In FIG. 12A, parts that are the same as those shown in the previously described figures are the same reference numbers. FIG. 12B is a block diagram of a configuration of a bit line control circuit 23B shown in FIG. 12A. FIG. 12C is a block diagram of a configuration of a word line control circuit 24B shown in FIG. 12A.

According to the second embodiment of the present invention, the read operation is caused to progress up to the time immediately before the word line is activated. For this read operation, the bit line control circuit 23B is configured as shown in FIG. 12B, and the word line control circuit 24B is configured as shown in FIG. 12C.

The bit line control circuit 23B shown in FIG. 12B includes the delay circuit 32, the pulse generator circuit 33, a delay circuit 44, a NOR gate 45 and an inverter 46. Further, the circuit 23B includes inverters 47 and 48, which generate the bit line short-circuit timing signal blrpz from the write command wrpz.

The word line control circuit 24B shown in FIG. 12C includes a delay circuit 49, NOR gates 50 and 52, and inverters 51 and 53 in addition to the aforementioned flip-flops 39 and 40, the NAND gate 41, the inverter 42 and the delay circuit 43.

A description will be given, with reference to FIGS. 13A and 13B, of the read operation that progresses up to the step of activating the word line after the external address is latched in FIGS. 12A through 12C. FIG. 13A shows a case where the output enable signal /OE switches to L from the output disable state (read operation), and FIG. 13B shows a case where the write enable signal /WE switches to L from the output disable state (write operation).

The operation up to the time when the activation signal rasz rises after the chip enable signal /CE switches to L in FIGS. 13A and 13B is the same as the operation of the first embodiment of the present invention shown in FIGS. 11A and 11B. The activation signal rasz passes through the delay circuit 32, the pulse generator circuit 33, the NOR gate 45 and the inverter 46 shown in FIG. 12B, and is output as the timing signal blspz for releasing the bit lines from the short-circuit state. In response to the above, the bit line short control signal brsx is changed to L, and the transistors 62–64 shown in FIG. 9 are turned OFF, so that the bit lines BL and /BL can be released from the shortcircuited state. The operation of releasing the bit lines BL and /BL from the short-circuited state differs from that shown in FIG. 11A, namely, the operation of releasing the bit lines from the short-circuit state in response to the read command rdpz. The bit line short-circuit release timing signal blspz passes through the delay circuit 49 shown in FIG. 12B, and sets the flip-flop 39, so that its output n1 is changed to H. The delay circuit 49 functions to define the time when the word line is activated from the bit lines are released from the short-circuited state.

In FIG. 12A, the word line control circuit shown in FIG. 12B generates the word line drive timing signal wlspz in response to the read command rdpz that is generated in response to the falling edge of the output enable signal /OE. The read command rdpz passes through the NOR gate 50 and the inverter 51, and sets the flip-flop 40, so that its output n2 is changed to H. As a result, n1=n2=H, and the word line control circuit 24B outputs the word line drive timing signal wlspz.

In FIG. 12B, when the write enable signal /WE changes to L in the output disable state, the write command wrpz generated by the command decoder 21A is applied to the bit line control circuit 23B and the word line control circuit 24B. The delay circuit 44 of the bit line control circuit 23B delays the write command wrpz and thus generates the bit line short-circuit release timing signal blspz. The write command wrpz passes through the inverters 47 and 48 of the bit line control circuit 23B, and is output as the bit line short-circuit timing signal blrpz because of the following. The bit lines have been short-circuited in response to the activation signal rasz, and the read address differs from the write address. Thus, in order to perform the write operation, the bit lines BL and /BL selected by the read address must be short-circuited. On the other hand, the bit line short-circuit release timing signal blspz passes through the delay circuit 49 of the word line control circuit 24B, and sets the flip-flop 39. Since the flip-flop 40 has been set by the write command wrpz, the word line drive timing signal wlspz is thus generated.

In the bit line control circuit 23B shown in FIG. 23B, the delay circuit 32 is reset by the write command wrpz in order to prevent the bit line short-circuit release timing signal blspz from the activation signal rasz when the device is switched to the write state from the output disable state during the time when the activation signal rasz switches to H and the bit line short-circuit release timing signal blspz is output.

Similarly, in the word line control circuit 24B, the delay circuit 49 is reset by the write command wrpz taking into consideration a situation in which the device may be changed to the write state during the time when the output n1 is changed to H after the bit line short-circuit release timing signal blspz is output.

The operations following the operations shown in FIGS. 13A and 13B are the same as those of FIG. 8.

Figure 14:
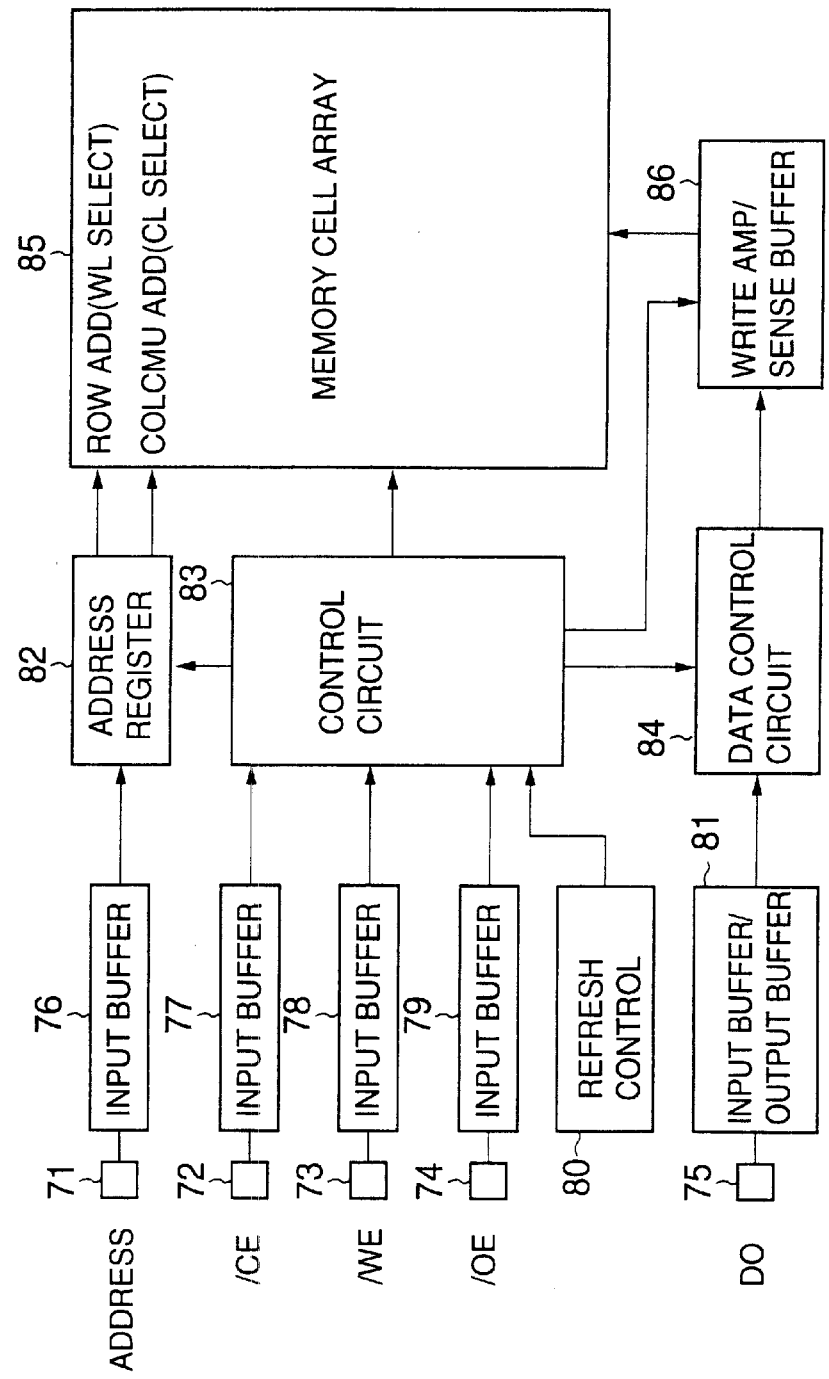
FIG. 14 is a block diagram of an entire configuration of the semiconductor memory device according to one aspect of the present invention.

FIG. 14 is a block diagram of a configuration of the semiconductor memory device of the present invention. The semiconductor memory device includes an address terminal 71, command input terminals 72–74, a data input/output terminal 75, input buffers 76–79 respectively connected to the terminals 71–74, a refresh control circuit 80 for controlling refresh operation, an input buffer/output buffer 81, an address register 82, a control circuit 83, a data control circuit 84, a memory cell array (core) 85, and a write amplifier/sense buffer 86. The address register 82 includes the aforementioned address latch circuit 26, the address decoder 27 and the redundancy decision circuit 28. The control circuit 83 has the configurations shown in FIGS. 10A, 10B, 12A, 12B and 12C except the address latch circuit 26, the address decoder 27 and the redundancy decision circuit 28. The memory cell array 85 has the configuration shown in FIG. 9. The write amplifier/sense buffer 86 includes write amplifiers and sense buffers connected to the internal data buses DB and /DB.

The external address is received via the address terminal 71 and the input buffer 76. The decoded addresses of the row and column systems are applied to the memory cell array 85. The signals /CE, /WE and /OE are applied to the control circuits via the buffers 77, 78 and 79, respectively. The data input/output circuit 84 controls the input/output operation under the control of the control circuit 83.

According to the present invention, the read operation is caused to progress highway in the DRAM having the asynchronous type SRAM interface, so that data can be read quickly from the output disable state.

The present invention is not limited to the specifically disclosed embodiments, and variations and modifications may be made without departing from the scope of the present invention.

The present application is based on Japanese Priority Patent Application No. 2000-054881 filed on Feb. 29, 2000, the entire contents of which are hereby incorporated by reference.

What is claimed is:

1. A semiconductor memory device, comprising:
    an address buffer circuit for outputting a first address signal, received in a preceding write cycle, to a core portion of the memory device in response to a leading edge of a write control signal and for receiving a second address signal from outside in response to the leading edge of the write control signal;
    a data buffer circuit for outputting a first write data, received in a preceding write cycle, to the core portion in response to the leading edge of the write control signal and for receiving a second write data from outside in response to a trailing edge of the write control signal.

2. The semiconductor memory device as claimed in claim 1, wherein the first write data, which corresponds to the first address signal and is received in the preceding write cycle, is written in a designated memory cell in the core portion in a next write cycle.

3. The semiconductor memory device as claimed in claim 1, wherein the address buffer circuit outputs said first address signal then receives said second address signal.

4. The semiconductor memory device as claimed in claim 1, wherein the data buffer circuit outputs said first write data before a timing of the trailing edge of the write control signal.

5. The semiconductor memory device as claimed in claim 1, wherein the address buffer comprising:

an address latch circuit;

a first transmission gate disposed between an address input terminal and the address latch circuit; and a second transmission gate disposed between the address latch circuit and the core portion.

6. The semiconductor memory device as claimed in claim 5, wherein the second transmission gate turns on in response to the leading edge of the write control signal to output the first address signal stored in the address latch circuit to the core portion, then the first transmission gate turns on so as to receive the second address signal at the address input terminal.

7. The semiconductor memory device as claimed in claim 5, wherein the address buffer circuit further including:

a third transmission gate disposed between the address input terminal and the core portion and coupled in parallel with the address latch circuit and the first and second transmission gates, wherein the third transmission gate operates in a read operation of the memory device.

8. The semiconductor memory device as claimed in claim 1, wherein the data buffer circuit comprising:

a data latch circuit;

a first transmission gate disposed between a data input terminal and the data latch circuit; and a second transmission gate disposed between the data latch circuit and the core portion.

9. The semiconductor memory device as claimed in claim 8, wherein the second transmission gate turns on in response to the leading edge of the write control signal to output the first write data stored in the data latch circuit to the core portion, then the first transmission gate turns on in response to the trailing edge of the write control signal so as to receive the second write data at the data input terminal.

* * * * *